United States Patent [19]

Yamada

[11] Patent Number: 4,556,909
[45] Date of Patent: Dec. 3, 1985

[54] SOLID STATE IMAGE SENSING DEVICE HAVING A NUMBER OF STATIC INDUCTION TRANSISTORS ARRANGED IN A MATRIX FORM

[75] Inventor: Hidetoshi Yamada, Tokyo, Japan
[73] Assignee: Olympus Optical Co. Ltd., Tokyo, Japan
[21] Appl. No.: 647,169
[22] Filed: Sep. 4, 1984
[30] Foreign Application Priority Data Sep. 9, 1983 [JP] Japan .................................. 58-165237

[51] Int. Cl.⁴ .............................................. H04N 3/14
[52] U.S. Cl. ..................................... 358/212; 357/22; 357/24
[58] Field of Search ............. 357/22, 43, 23.6, 24 LR; 358/213, 212

[56] References Cited

U.S. PATENT DOCUMENTS 4,233,632 11/1980 Akiyama ............................. 358/212
4,328,432 5/1982 Yamazaki ....................... 307/221 D
4,427,990 1/1984 Nishizawa .............................. 357/22
4,454,526 6/1984 Nishizawa et al. .................... 357/30
4,462,047 7/1984 Fujimoto et al. ..................... 358/212
4,504,847 3/1985 Nishizawa .............................. 357/22

Primary Examiner—Gene Z. Rubinson
Assistant Examiner—Robert G. Lev
Attorney, Agent, or Firm—Parkhurst & Oliff

[57] ABSTRACT

A solid state image sensing device having a number of static induction transistors (SIT) arranged in a matrix form, sources of SITs arranged in each column being commonly connected to respective column line which is connected to a video line via respective column selection transistor whose gate is connected to a horizontal scanning circuit, gates of SITs arranged in each row being connected to respective row line connected to a vertical scanning circuit, and drains of all the SITs being commonly connected to the ground. The vertical scanning circuit produces a row selection signal which has such a potential that an SIT is readout, while its gate is biased reversely.

11 Claims, 48 Drawing Figures

FIG. 1A
PRIOR ART
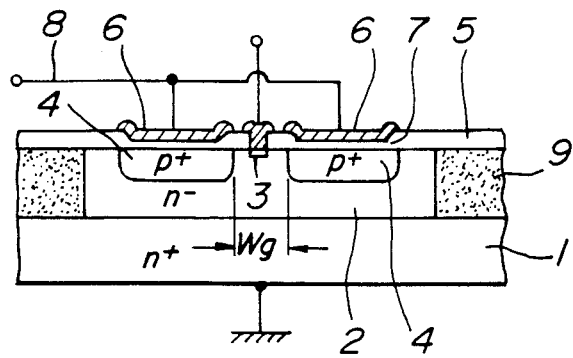
FIG. 1B
PRIOR ART
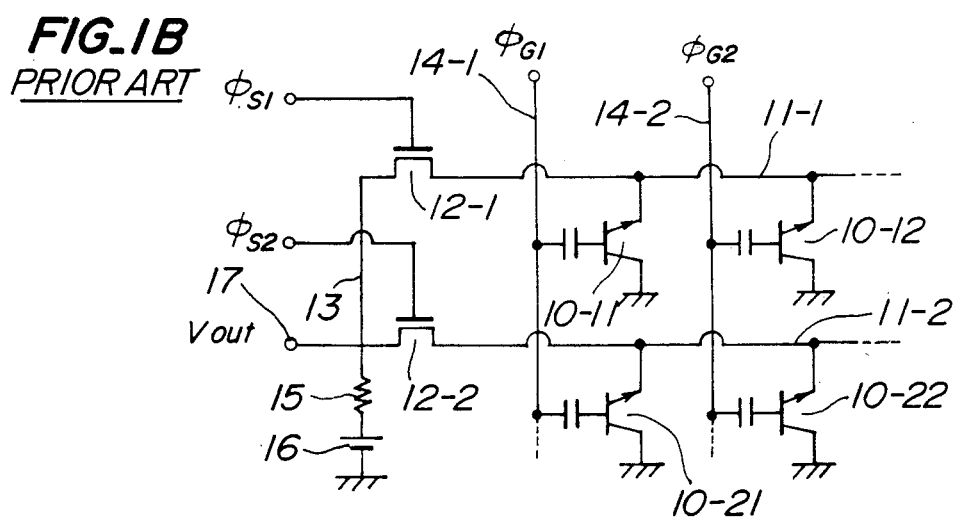
FIG. 2A $\phi_{S1}$
PRIOR ART
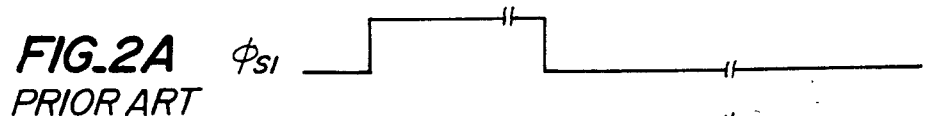
FIG. 2B $\phi_{S2}$
PRIOR ART
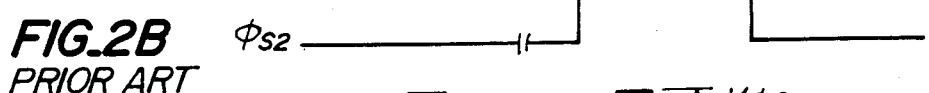
FIG. 2C $\phi_{G1}$
PRIOR ART
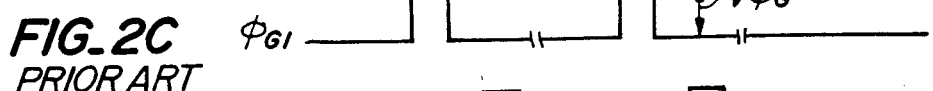
FIG. 2D $\phi_{G2}$
PRIOR ART

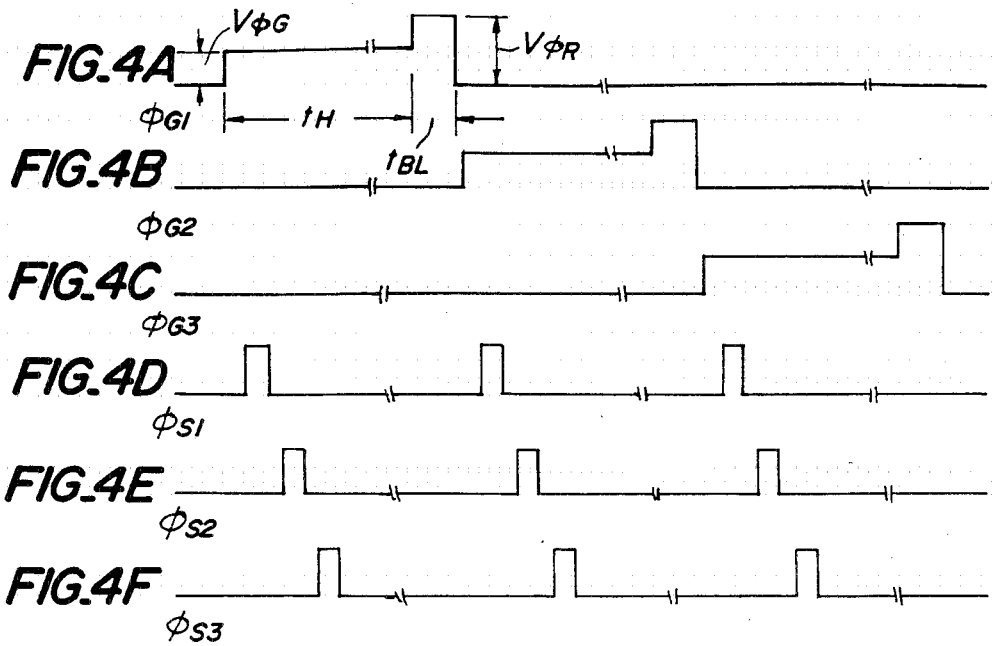
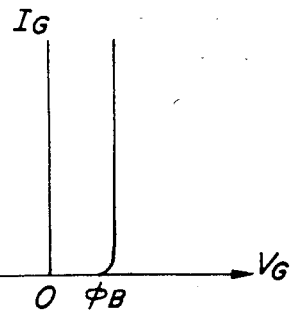
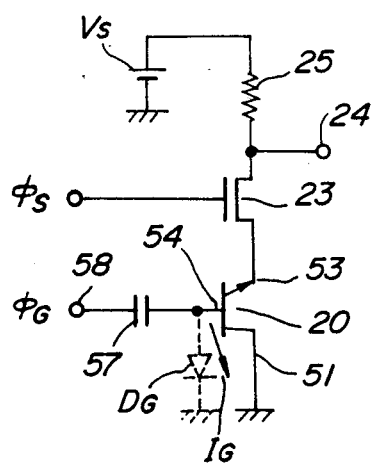
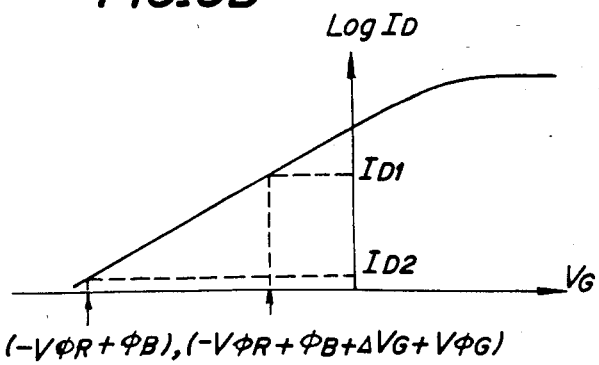

FIG. 7A
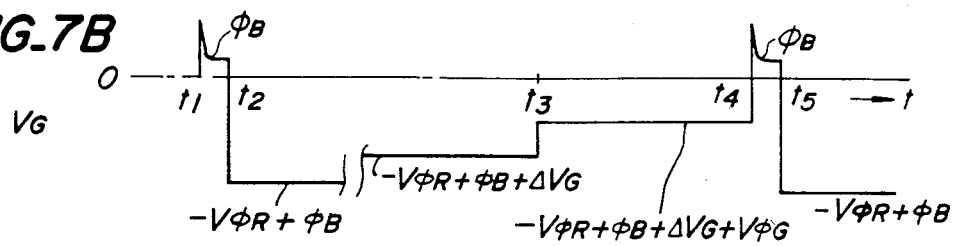
FIG. 7B
FIG. 8
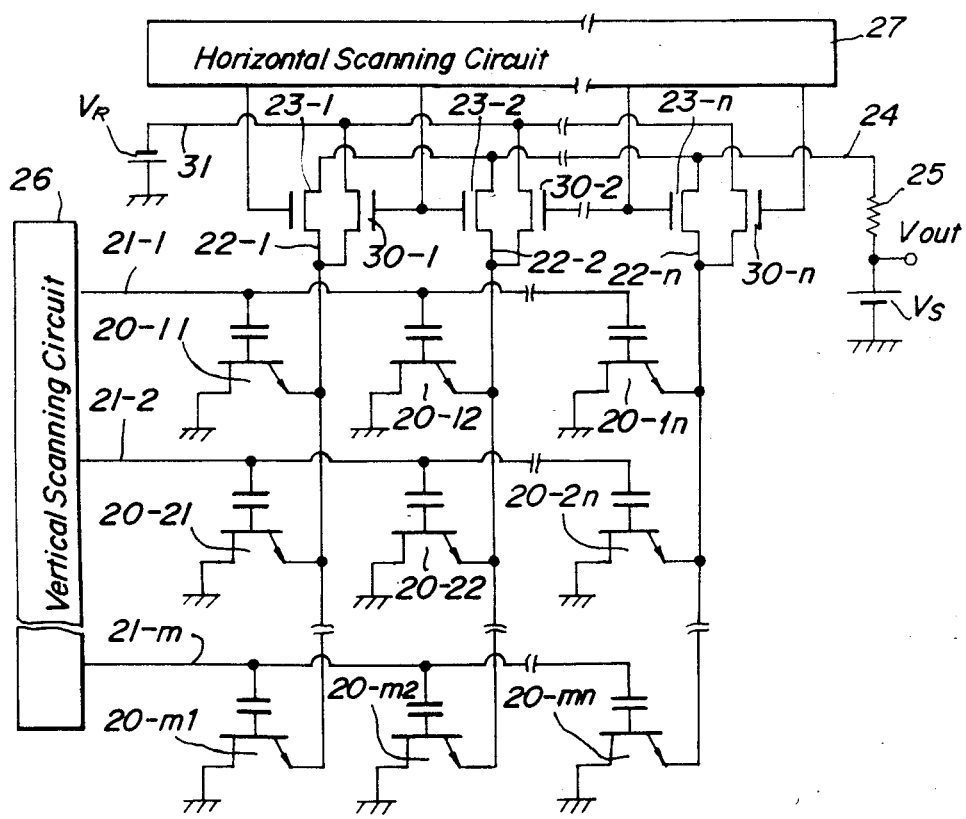

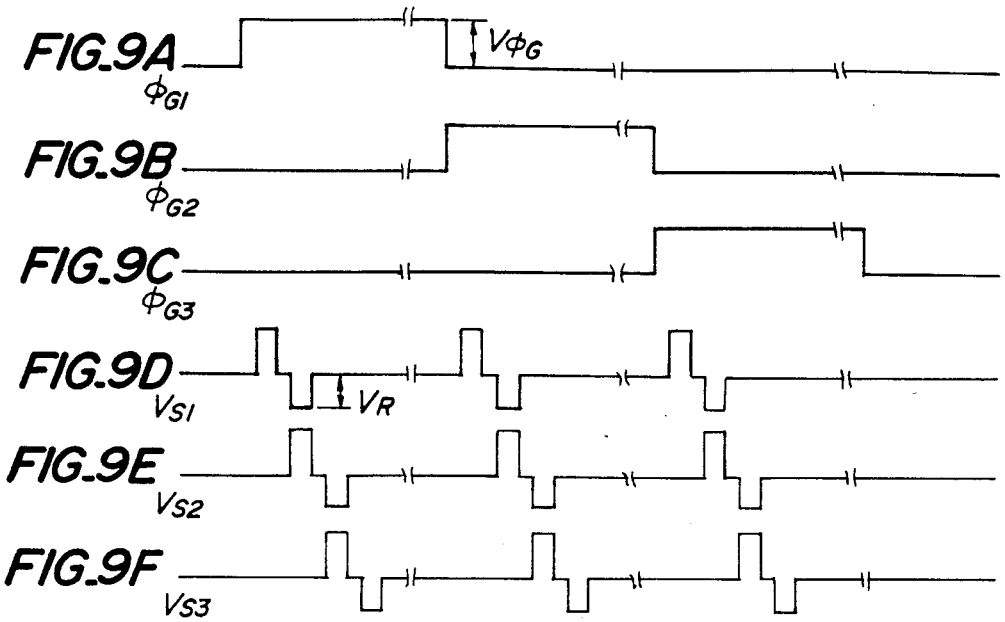
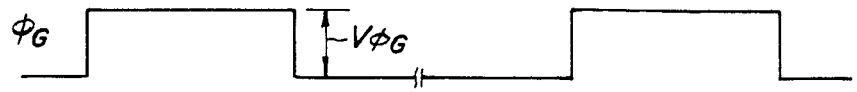
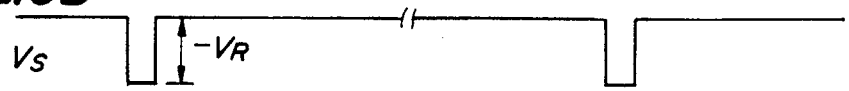
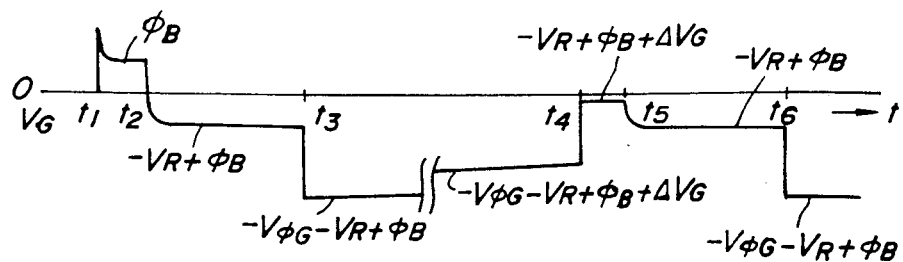

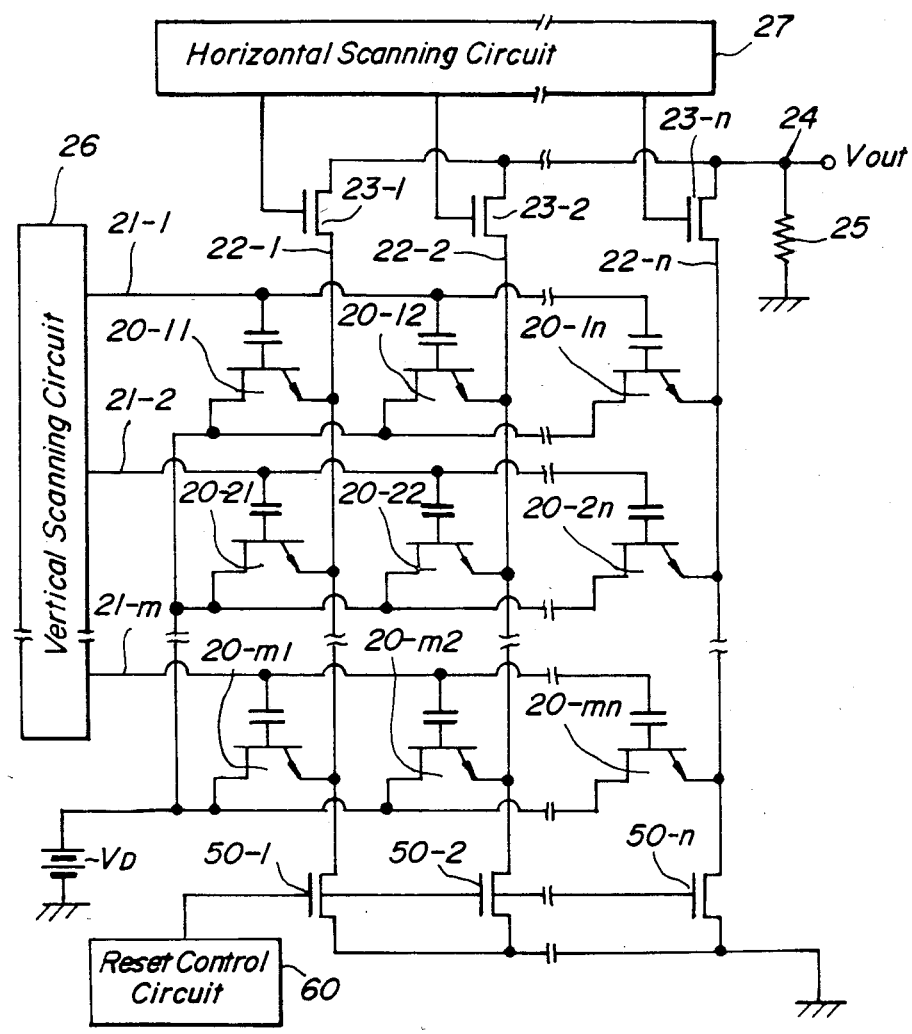
FIG_13

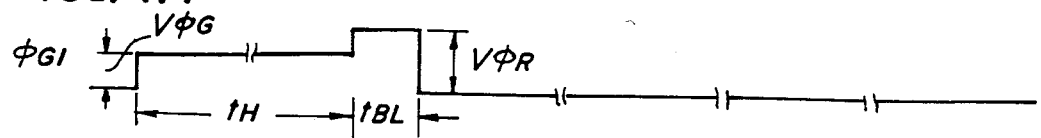
FIG_14A $\phi_{G1}$
FIG_14B $\phi_{G2}$
FIG_14C $\phi_{Gm}$
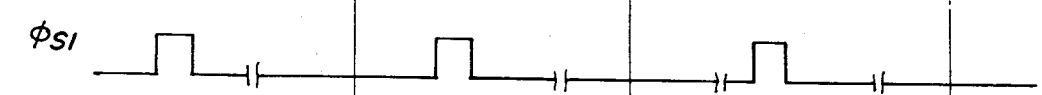
FIG_14D $\phi_{S1}$
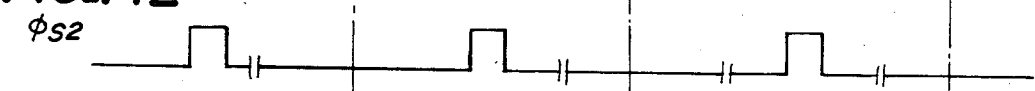
FIG_14E $\phi_{S2}$
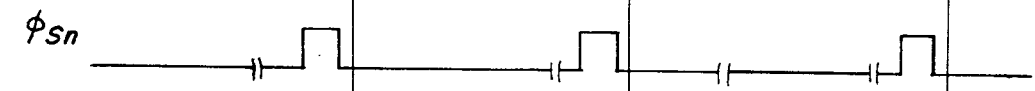
FIG_14F $\phi_{Sn}$
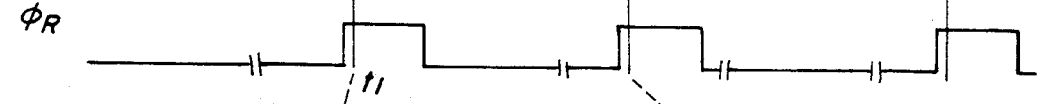
FIG_14G $\phi_R$
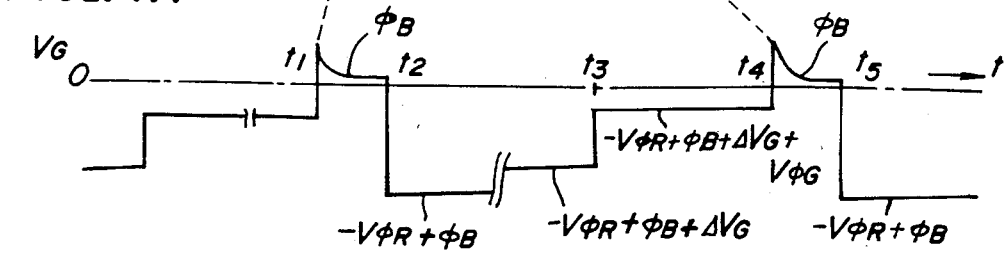
FIG_14H

SOLID STATE IMAGE SENSING DEVICE HAVING A NUMBER OF STATIC INDUCTION TRANSISTORS ARRANGED IN A MATRIX FORM

BACKGROUND OF THE INVENTION

The present invention relates to a solid state image sensing device comprising a number of static induction transistor cells arranged in a matrix form.

A solid state image sensing device having a number of cells arranged in a matrix form, each cell including a static induction transistor (hereinafter abbreviated as SIT) serving both as a photodetecting element and a switching element has been disclosed in a Japanese Patent Application Laid-open Publication No. 105,672/83.

FIG. 1A is a cross section illustrating an SIT forming a unit pixel of such a known solid state image sensing device and FIG. 1B is a circuit diagram showing a whole construction of such a solid state image sensing device. As shown in FIG. 1A, and SIT 1 comprises an n+ silicon substrate 1 constituting a drain, an n− silicon epitaxial layer 2 having a lower impurity concentration than that of the substrate 1, an n+ source region 3 and a p+ gate region 4, these regions 3 and 4 being formed by, for instance the thermal diffusion method. To the gate region 4 is applied an insulating film 5 made of, for example SiO$_2$, and to the insulating film 5 is further applied a gate electrode 6. The gate region 4 constitutes a capacitance 7 together with the insulating film 5 and gate electrode 6. The gate electrode 6 is connected to a gate terminal 8. Adjacent SITs constituting the cells are isolated from each other by an isolation region 9 made of, for instance a buried insulating material. The n− epitaxial layer 2 constitutes a channel region of SIT. In the known solid state image sensing device, the SITs are formed as a normally-off type and thus, although the gate potential is zero volt, the channel region has been already depleted, so that even if a voltage is applied across the source and drain, a current does not flow between the source and drain.

In the known solid state image sensing device comprising the SITs of normally-off type, when a light input is given, hole-electron pairs are generated in the channel region 2 or the gate depletion layer. Electrons flow away into the drain, i.e. substrate 1 which is connected to the earth potential, but holes are stored in the signal storing gate region 4 and as the result of this the gate potential is increased by $\Delta V_G$. Now it is assumed that the value of the gate capacitance 7 is $C_G$ and an amount of charge stored in the signal storing gate region 4 is $Q_L$. Then $\Delta V_G = Q_L/C_G$ is obtained. After elapsing a certain signal storing time, when a gate readout pulse $V_{\phi G}$ is applied to the gate terminal 8, the gate potential becomes a sum of $V_{\phi G}$ and $\Delta V_G$. Therefore, the potential between the signal storing gate region 4 and source region 3 is lowered and the depletion layer is decreased. Then a drain current corresponding to the light input flows between the source and drain. The drain current is proportional to $\Delta V_G$ increased by an amplification factor due to the amplifying function of SIT. It should be noted that the similar operation can be attained even if the source and drain of SIT are exchanged with each other.

FIG. 1B illustrates the circuit construction of the solid state image sensing device comprising the above explained SITs arranged in a matrix form. FIGS. 2A to 2D are signal waveforms for explaining the operation of the solid state image sensing device. SITs 10-11, 10-12 . . . are formed by n channel normally-off type SITs and an output video signal is readout in an XY address mode. A drain of an SIT constituting a pixel is connected to the earth potential. Sources of SITs arranged in rows, i.e. X direction are connected to row lines 11-1, 11-2 . . . , respectively which row lines are then connected commonly to a video line 13 via row selection transistors 12-1, 12-2 . . . , respectively. Further gate terminals of SITs arranged in columns, i.e. Y direction, are connected to column lines 14-1, 14-2 . . . , respectively. The video line 13 is connected via a load resistor 15 to a positive terminal of a D.C. voltage source 16 whose negative terminal is connected to the ground.

Next the operation for reading the output signals out of the pixels formed by SITs of the solid state image sensing device mentioned above will be explained. During a time interval in which a row selection pulse $\phi_{S1}$ shown in FIG. 2A is applied to a transistor 12-1 connected to a row line 11-1 to turn on said transistor 12-1, when a gate readout pulse $\phi_{G1}$ illustrated in FIG. 2C is applied to a column line 14-1, an SIT 10-11 is selected and a drain current of this SIT 10-11 flows through the load resistor 15 by means of the video line 13 to produce an output voltage $V_{out}$ at an output terminal 17. As explained above, the drain current is of a function of the gate potential which varies in accordance with the light input and thus an increment $\Delta V_{out}$ with respect to the voltage in the dark corresponds to the light input. In this case, the increment $\Delta V_{out}$ becomes a large voltage which is equal to $\Delta V_G$ multiplied by the amplification factor of the SIT. Next, a gate readout pulse $\phi_{G2}$ shown in FIG. 2D is applied to a second column line 14-2 to readout SIT 10-12. In this manner all the SITs in the first column are successively readout. After that, a row selection pulse $\phi_{S2}$ shown in FIG. 2B is applied to a second row selection transistor 12-2 to readout SITs in the second row. In this manner SITs of successive rows are readout sequentially.

The known solid state image sensing device explained above has been found to have the following disadvantages. When the gate readout pulse $\phi_G$ is applied to the gate region 4, a pn junction formed between the gate region 4 and drain is forwardly biased and therefore the holes stored in the gate region 4 flow away through the pn junction. In this manner, the light signals which have been stored in the gate regions of the SITs in a column line 14 are lost every time the gate readout pulse is applied to the relevant column line. Therefore, a light signal storing time in each pixel is determined by a ratio of the readout period with respect to the number of row lines and is equal substantially to a horizontal scanning period. In other words, it is assumed that the readout period is equal to T and the number of row lines is equal to n, then the light signal storing time is equal to T/n. Therefore, when the number of pixels is made large and thus the number of rows is increased, the storing time becomes extremely short and a light sensitivity is decreased. In this manner in the known solid state image sensing device it is practically impossible to derive a video signal having a high S/N.

Further in order to form the SIT as the normally-off type in the known solid state image sensing device, a distance $W_g$ between the inner edges of the gate region 4 has to be made very small. However, such a small distance could not be obtained easily in view of the manufacturing method.

Moreover, the normally-off type SIT has inherently a small current density and therefore, the signal current is very small.

As explained above, in the known solid state image sensing device, it is difficult to realize a useful device which can produce a large video signal and can be manufactured easily.

SUMMARY OF THE INVENTION

The present invention has for its object to provide a solid state image sensing device in which the photocharge can be stored over a long storing time by providing means for reversely biasing the pn junction of the gate region and a video signal having a high S/N can be derived with a high sensitivity by providing means for resetting the photocharge.

It is another object of the invention to provide a solid state image sensing device comprising normally-on type SITs which can be manufactured easily.

According to the invention, a solid state image sensing device comprises
- a plurality of row lines;
- a plurality of column lines;
- means for applying row selection signals successively to said row lines;
- means for applying column selection signals successively to said column lines;
- a plurality of pixels arranged in a matrix form, each comprising a static induction transistor having one main electrode region connected to a column line, the other main electrode region connected commonly, a channel region disposed between said main electrode regions and a gate electrode region, and a capacitance connected between the gate electrode region and a row line; and
- means for biasing reversely said gate electrode region at the time of reading out said pixel.

BRIEF DESCRIPTION OF THE DRAWINGS

FIG. 1A is a cross section showing a construction of a static induction transistor constituting a pixel of a known solid state image sensing device;

FIG. 1B is a circuit diagram illustrating the whole construction of the known solid state image sensing device;

FIGS. 2A to 2D depict signal waveforms for explaining the operation of the known solid state image sensing device;

FIGS. 4A to 4F show signal waveforms for explaining the operation of the solid state image sensing device of FIG. 3B;

FIG. 5 is a circuit diagram for explaining the operational principle of the device of FIG. 3B;

FIGS. 6A and 6B are graphs illustrating characteristics of a diode and normally-on type static induction transistor, respectively;

FIGS. 7A and 7B are signal waveforms for explaining the operation of the circuit shown in FIG. 5;

FIG. 8 is a circuit diagram showing a second embodiment of the solid state image sensing device according to the invention;

FIGS. 9A to 9F and FIGS. 10A to 10C are signal waveforms for explaining the operation of the device shown in FIG. 8;

FIG. 13 is a circuit diagram of a fourth embodiment of the solid state image sensing device according to the invention; and FIGS. 14A to 14H are waveforms for explaining the operation of the device illustrated in FIG. 13.

DESCRIPTION OF THE PREFERRED EMBODIMENTS

Figure 3A:
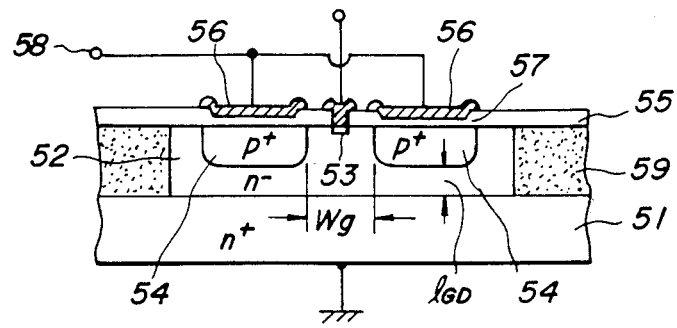
FIG. 3A is a cross section illustrating an static induction transistor forming a pixel of a first embodiment of the solid state image sensing device according to the invention.
Figure 3B:
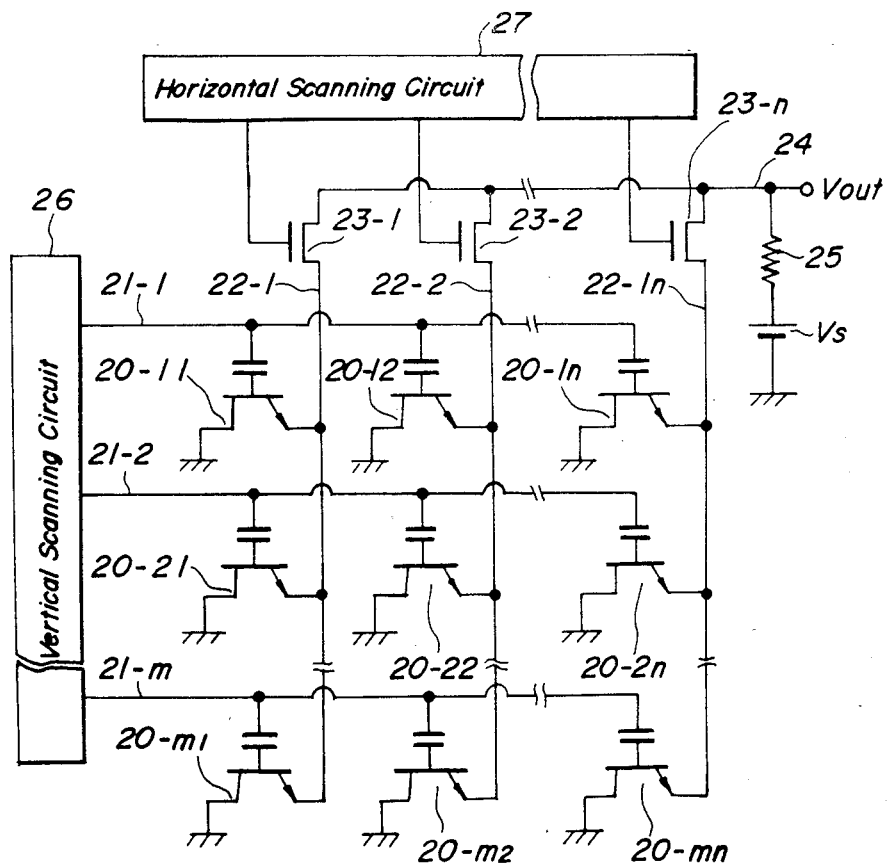
FIG. 3B is a circuit diagram of the first embodiment of the solid state image sensing device.

FIG. 3A is a cross section illustrating an embodiment of an SIT forming a pixel of the solid state image sensing device according to the invention, FIG. 3B is a circuit diagram showing a whole construction of the image sensing device, and FIGS. 4A to 4F show waveforms for explaining the operation of the image sensing device.

In FIG. 3A, the general construction of SIT is similar to that of the SIT shown in FIG. 1 and comprises an $n^+$ silicon substrate 51 serving as a drain region of SIT, an $n^-$ silicon epitaxial layer 52 forming a channel region, an $n^+$ source region 53 formed in the epitaxial layer 52, a $p^+$ gate region 54 formed in the epitaxial layer in such a manner that it surrounds the source region 53, an isolation region 59 made of insulating material for separating adjacent SITs from each other, an insulating layer 55 formed on the epitaxial layer 52, a gate electrode 56 formed above the gate region 54 via the insulating layer 55 to form a capacitance 57 therebetween, and a gate terminal 58 connected to the gate electrode 56. In the present invention, since use is made of a normally-on type SIT, a distance $W_g$ between inner edges of the gate region 54 can be made relatively large and thus the solid state image sensing device can be manufactured easily. It should be noted that the isolation region 59 may be formed by a $p^+$ diffusion region instead of insulating material.

As shown in FIG. 3B, a number of the normally-on type SITs 20-11, 20-12 ... 12-1n; 20-21, 20-22 ... 20-2n; ... ; 20-m1, 20-m2 ... 20-mn explained above are arranged in a matrix form and are readout successively in an XY address mode. For this purpose, the drains of all the SITs are connected to the earth potential, the gate electrodes 56 of SITs arranged in rows, i.e. X direction are connected to row lines 21-1, 21-2 ... 21-m, and the sources of SITs arranged in columns, i.e. Y direction are connected to column lines 22-1, 22-2 ... 22-n which are then connected commonly to a video line 24 via column selection transistors 23-1, 23-2 ... 23-n. The video line 24 is connected to a positive terminal of a video voltage supply source $V_s$ via a load resistor 25.

The row lines 21-1, 21-2 ... 21-m are connected to a vertical scanning circuit 26 and are applied with signals $\phi_{G1}, \phi_{G2} ... \phi_{Gm}$, respectively. The gate electrodes of column selection transistors 23-1, 23-2 ... 23-n are connected to a horizontal scanning circuit 27 and are applied with signals $\phi_{S1}, \phi_{S2} ... \phi_{Sn}$, respectively.

Next the vertical scanning signals $\phi_G$ and horizontal scanning signals $\phi_S$ will be explained with reference to the waveforms shown in FIGS. 4A to 4F. Each of the vertical scanning signals $\phi_{G1}, \phi_{G2} ... \phi_{Gm}$ applied to the row lines 21-1, 21-2 ... 21-m, respectively is consisting of a voltage $V_{\phi G}$ having a small amplitude and a voltage $V_{\phi R}$ having a large amplitude. The voltage $V_{\phi G}$ is applied during a horizontal scanning period $t_H$ of a single row line and the voltage $V_{\phi R}$ is applied during a horizontal blanking period $t_{BL}$. Each of the horizontal scanning signals $\phi_{S1}$, $\phi_{S2}$ . . . $\phi_{Sn}$ applied to the gates of column selection transistors 23-1, 23-2 . . . 23-n, respectively has a low level for cutting off the transistor and a high level for conducting the transistor.

FIG. 5 is an equivalent circuit diagram showing a construction of a single pixel. A normally-on type SIT 20 comprises the drain 51 connected to the earth potential, the gate 54, the capacitance 57 formed between the gate 54 and the gate terminal 58, and the source 53. The gate 54 and drain 51 of SIT 20 forms a pn junction diode $D_G$. This diode $D_G$ has a voltage current characteristic, i.e. gate potential $V_G$-current $I_G$ passing across the gate and drain shown in FIG. 6A. That is to say, when the voltage across the diode $D_G$, i.e. the voltage $V_G$ exceeds the built-in barrier voltage $\phi_B$ of the pn junction, a forward current flows abruptly.

The current $I_D$ flowing between the source and drain of SIT is determined by the gate voltage $V_G$. In a typical normally-on type SIT, $I_D$ is exponentially proportional to $V_G$ as illustrated in FIG. 6B.

Now the gate potential variation of SIT will be explained with reference to FIGS. 7A and 7B, when the signal $\phi_G$ is applied to the gate 54 of SIT via the capacitance 57. At a time instant $t_1$, the signal $\phi_G$ assumes $V_{\phi R}$, then the forward current passes through the diode $D_G$ via the capacitance 57 which is charged abruptly up to a voltage $(V_{\phi R} - \phi_B)$. As the result of this, the gate voltage $V_G$ becomes equal to $\phi_B$. Next at a time instant $t_2$, the signal $\phi_G$ becomes zero and then the diode $D_G$ is biased reversely so that the current $I_G$ does not flow. Therefore, the voltage $(V_{\phi R} - \phi_B)$ is maintained across the capacitance 57 and $V_G$ becomes equal to $-V_{\phi R} + \phi_B$. After that, the charge $Q_L$ is stored due to the light input until a time instant $t_3$ at which the high voltage $V_{\phi G}$ of the signal $\phi_G$ is applied. Then the voltage $V_G$ is increased by $\Delta V_G = Q_L/C_G$, wherein $C_G$ is a value of the capacitance 57. At the instant $t_3$, since the voltage $V_{\phi G}$ is applied, the gate voltage is increased up to $-V_{\phi R} + \phi_B + \Delta V_G + V_{\phi G}$. Also at this instant $t_3$, the column selection transistor 23 is made conductive by the signal $\phi_S$, the current $I_{D1}$ shown in FIG. 6B flows through the SIT and the signal output $V_{out} = V_S - I_{D1} \cdot R_L$ appears on the video line 24. Since the current $I_{D1}$ is changed in accordance with $\Delta V_G$, it is possible to obtain the video signal corresponding to the light input.

As illustrated in FIG. 7A, at a time instant $t_4$, the signal $\phi_G$ assumes again the value $V_{\phi R}$ and the gate potential $V_G$ becomes equal to $\phi_B$ to clear the change $Q_L$ which has been stored until this instant $t_4$. At a time instant $t_5$, the signal $\phi_G$ becomes equal to zero volt and the gate potential $V_G$ is reset again to the value $-V_{\phi R} + \phi_B$ to initiate the charge storage for a next field.

As can be understood from the above explanation, the high amplitude voltage $V_{\phi R}$ of the signal should be determined to such a value that the drain current $I_D$ of SIT corresponding to the gate potential $V_G = -V_{\phi R} + \phi_B$ is made sufficiently small to cut-off the SIT. The small amplitude voltage of the signal $\phi_G$ is determined in such a manner that in order to prevent the gate current from flowing during the row selection time, condition of $V_{\phi G} < V_{\phi R} - \Delta V_G$ is satisfied, this condition being derived from the necessary condition that the gate potential $V_G = -V_{\phi R} + \phi_B + \Delta V_G + V_{\phi G}$ at the time instant $t_3$ should be lower than $\phi_B$.

Now the operation of the solid state image sensing device shown in FIG. 3B will be explained on the basis of the above mentioned operational principle of a single pixel. Due to the operation of the vertical scanning circuit 26, when the signal $\phi_{G1}$ becomes equal to $V_{\phi G}$, SITs connected to the row line 21-1 are selected. Then the column selection transistors 23-1, 23-2 . . . 23-n are successively made conductive by means of the signals $\phi_{S1}$, $\phi_{S2}$ . . . $\phi_{Sn}$, respectively supplied from the horizontal scanning circuit 27 and the signals stored in the SITs 20-11, 20-12 . . . 20-1n are successively readout on the video line 24. Next all the SITs of the first row are reset when the signal $\phi_G$ becomes the high level value $V_{\phi R}$. Next the signal $\phi_{G2}$ is supplied from the vertical scanning circuit 26 and SITs belonging to the second row are selected. Then the signals stored in these SITs 20-21, 20-22 . . . 20-2n are successively readout by the horizontal scanning signals $\phi_{S1}$, $\phi_{S2}$ . . . $\phi_{Sn}$ and subsequently all the SITs of the second row are reset simultaneously. In a similar manner, successive pixels are readout to obtain the video signal of one field. The above operation has been experimentally conformed to be performed well.

In the SIT shown in FIG. 3A, if a distance $l_{GD}$ between the gate region 54 and the drain, i.e. substrate 51 is long, the gate-drain current becomes small due to the bulk resistance of the epitaxial layer 52 and thus the operation for resetting the gate becomes imperfect. Therefore, the length $l_{GD}$ is preferably made small such as 1 to 3 μm. In the NTSC standard television system, the horizontal blanking period $t_{BL}$ equals nearly to 1.2 μs and during this short period the gate can be reset sufficiently well.

FIG. 8 is a circuit diagram illustrating another embodiment of the solid state image sensing device according to the invention, and FIGS. 9A to 9F show waveforms for explaining the operation thereof. In FIG. 8, portions similar to those shown in FIG. 3B are denoted by the same reference numerals used in FIG. 3B. In the present embodiment, to column lines 22-1, 22-2 . . . 22-n are connected reset transistors 30-1, 30-2 . . . 30-n, respectively in addition to the column selection transistors 23-1, 23-2 . . . 23-n. The sources of all the reset transistors 30-1, 30-2 . . . 30-n are commonly connected to a reset line 31 which is then connected to a negative terminal of a reset voltage supply source $V_R$ whose positive terminal is connected to the ground. The gate electrodes of the reset transistors 30-1, 30-2 . . . 30-n are connected to a horizontal scanning circuit 27 in such a manner that the signals $\phi_S$ to be supplied to succeeding column selection transistors 23-2, 23-3 . . . are supplied to the reset transistors 30-1, 30-2 . . . , respectively. That is to say, the signal $\phi_{S2}$ is supplied to the reset transistor 30-1, the signal $\phi_{S3}$ is supplied to the reset transistor 30-2, and so on.

FIGS. 9A to 9C show the vertical scanning signals $\phi_{G1}$, $\phi_{G2}$ and $\phi_{G3}$ supplied to the row lines 21-1, 21-2 and 21-3, respectively. During the row line selection period, the signal $\phi_G$ assumes a voltage $V_G$, but in the remaining period assumes zero volt. FIGS. 9D to 9F depict the potential variations $V_{S1}$, $V_{S2}$ and $V_{S3}$ at the column lines 22-1, 22-2 and 22-3, respectively. For instance, when the first column transistor 23-1 is made conductive, the potential $V_S$ becomes a positive voltage corresponding to the signal output, but when the reset transistor 30-1 is made conductive, the potential $V_{S1}$ assumes a negative voltage $V_R$.

In the present embodiment, when the negative voltage $V_R$ is applied to the column line, a source-drain current flows in SIT to react the gate. It should be noted that SITs 20-11, 20-12 ... 20-mn each constituting a single pixel of the image sensing device are formed by normally-on type SITs, in each of which the gate and source constitute a pn junction to provide the current-voltage characteristic shown in FIG. 6A.

Next, the variation of the gate voltage $V_G$ will be explained with reference to FIGS. 10A to 10C. At a time instant $t_1$, the signal $\phi_G$ assumes the value $V_{\phi G}$ and the forward current flows between the gate and drain via the capacitance 57. Therefore, the gate potential $V_G$ which has been zero volt becomes $\phi_B$. Next at a time instant $t_2$, the potential $V_S$ on the column line becomes a negative voltage $-V_R$. Then the current flows between the gate and source and the gate potential $V_G$ is decreased to $-V_R+\phi_B$. At a time instant $t_3$, when the signal $\phi_G$ changes from $V_{\phi G}$ to zero volt, the gate potential $V_G$ becomes equal to $-V_{\phi G}-V_R+\phi_B$ to bias reversely the gate-source. After the gate potential $V_G$ has been increased by $\Delta V_G$, at a time instant $t_4$ the signal $\phi_G$ assumes again the value $V_{\phi G}$ and the gate potential $V_G$ becomes equal to $-V_R+\phi_B+\Delta V_G$. Then at a time instant $t_5$, the potential $V_S$ on the column line assumes the value $-V_R$ and the gate potential $V_G$ is decreased to $-V_R+\phi_B$ to reset the gate. After that a similar operation is repeated.

As apparent from the above explanation of the operational principle, in the present embodiment when the vertical scanning signal $\phi_{G1}$ becomes the high level $V_{\phi G}$, the row line 21-1 is selected. Then, when the column selection transistor 23-1 is made conductive by the horizontal scanning signal $\phi_{S1}$, the photoelectric signal stored in the SIT 20-11 is readout on the video line 24. Next, when the column selection transistor 23-2 is made conductive by means of the horizontal scanning signal $\phi_{S2}$, the photoelectric signal stored in the SIT 20-12 is readout and at the same time the reset transistor 30-1 is made conductive to reset the gate potential of the SIT 20-11. In a similar manner, the SITs 20-12, 20-13 . . . 20-mn are successively readout and then their gate potentials are successively reset to obtain the video signal of one field or frame.

In the present embodiment, the reset transistors 30-1, 30-2 . . . are driven by the horizontal scanning signals $\phi_{S2}$, $\phi_{S3}$ . . . applied to the column selection transistors 23-2, 23-3 . . . However, it is a matter of course that the reset transistors may be driven by signals having different timings from those of the horizontal scanning signals or by signals supplied from a circuit different from the horizontal scanning circuit 27.

In the above mentioned embodiment, since a time interval between the reset timing and the readout timing is completely identical for respective pixels, the evenness of the image can be improved. Further, when said time interval is made shorter than the field or frame period, it is possible to attain a shutter function and a shart image of a rapidly moving object can be obtained effectively.

The embodiments so far explained are particularly applicable to the television camera for taking the images continuously. However, the present invention can be advantageously applied to the device for taking discrete images, i.e. an electronic still camera. Now such an embodiment of the invention will be explained hereinbelow.

Figure 11:
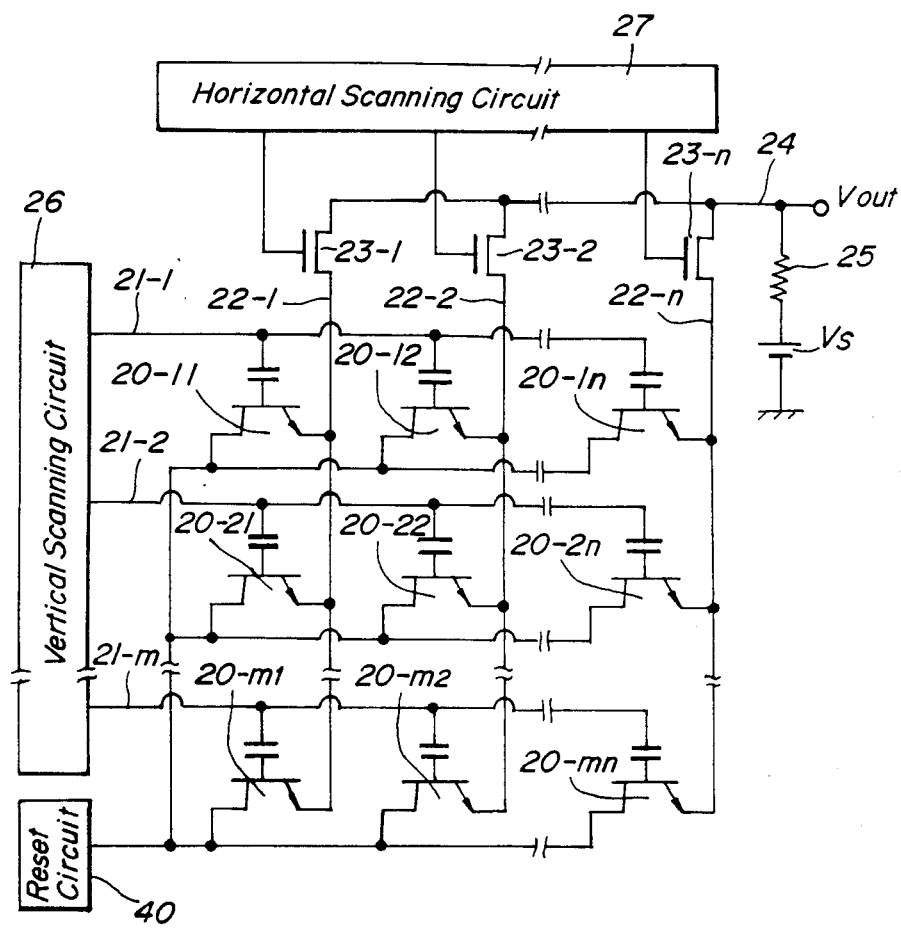
FIG. 11 is a circuit diagram depicting a third embodiment of the solid state image sensing device according to the invention.
Figure 12A:
FIGS. 12A to 12I show signal waveforms for explaining the operation of the device illustrated in FIG. 11.
Figure 12B:
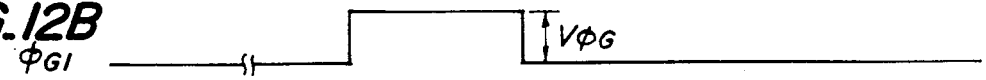
Figure 12C:
Figure 12D:
Figure 12E:
Figure 12F:
Figure 12G:
Figure 12H:
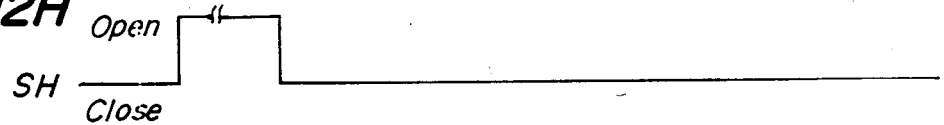
Figure 12I:
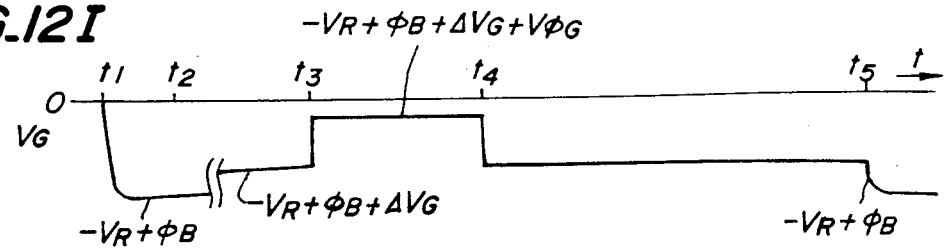

FIG. 11 is a circuit diagram showing an embodiment of the solid state image sensing device according to the invention which is preferably applied to the electronic still camera, and FIGS. 12A to 12H are waveforms for explaining the operation thereof. The principle construction of this device is same as that of the first embodiment, but in the present embodiment the commonly connected drains of SITs 20-11, 20-12 . . . 20-mn are not connected to the ground, but are coupled to a reset circuit 40 for generating a reset signal $\phi_R$ shown in FIG. 12A. The reset signal $\phi_R$ assumes a negative voltage $-V_R$ only for a time period for resetting the SITs, and in the remaining period the reset signal $\phi_R$ assumes zero volt. Vertical scanning signals $\phi_{G1}$, $\phi_{G2}$ . . . shown in FIGS. 12B to 12D assumes a high level $V_{\phi G}$ only when corresponding row lines 21-1, 21-2 . . . are scanned, and assumes zero volt in the remaining periods. FIGS. 12E to 12G illustrate column selection signals $\phi_{S1}$, $\phi_{S2}$ and $\phi_{S3}$, FIG. 12H shows an operation of a shutter, and FIG. 12I depicts a variation of a gate potential $V_G$.

At a time instant $t_1$, the reset signal $\phi_R$ becomes $-V_R$ and currents flowed between the gates and drains of all the SITs to reset the gate potential $V_G$ to $-V_R+\phi_B$. After that, at a time instant $t_2$, the shutter is opened and a light input is applied. Then the gate potential $V_G$ is increased to $-V_R+\phi_B+\Delta V_G$. At a time instant $t_3$, when the vertical scanning signal $\phi_{G1}$ is changed to the high level $V_{\phi G}$, the gate potential $V_G$ of the SIT group coupled with the first row line 21-2 is increased to $-V_R+\phi_B+\Delta V_G+V_{\phi G}$. When the column selection transistors 23-1, 23-2 . . . 23-n are successively made conductive by the horizontal scanning signals, the signals stored in the SITs 20-11, 20-12 . . . 20-1n are successively readout. Next, at a time instant $t_4$, the signal $\phi_{G1}$ is changed from $V_{\phi G}$ to zero volt, and the signal $\phi_{G2}$ is changed to the high level $V_{\phi G}$. Then the SITs 20-21, 20-22 . . . 20-2n belonging to the second row are successively readout. In a similar manner, SITs 20-31, 20-32 . . . 20-mn are successively readout to obtain a video signal of a single picture. Then at a time instant $t_5$, when the reset signal $\phi_R$ assumes $-V_R$, the currents flowed in all SITs between the gate and drain and thus, the gate potential $V_G$ of all SITs is reset to $-V_R+\phi_B$ to prepare for a next exposure.

FIG. 13 is circuit diagram showing a modification of the embodiment of the image sensing device according to the invention shown in FIG. 3B. In the embodiment of FIG. 3B, use is made of the common drain construction in which the drain is connected to the ground and the positive voltage is applied to the source to effect the signal readout. However, in the present embodiment, the positive voltage is applied to the drain by a drain voltage supply source $V_D$ and the source is coupled with the ground via a load resistor 25 to form a so-called common source configuration.

In the present embodiment, in order to reset the gate potential, it is necessary to provide reset transistors 50-1, 50-2 . . . 50-n for each column lines 22-1, 22-2 . . . 22-n for connecting the column lines to the ground, because the positive voltage is applied to the drain. The reset transistors 50-1, 50-2 . . . 50-n are made conductive by reset pulses applied to the gate from a reset control circuit 60. The drains of all the SITs are commonly connected on the substrate to which the positive drain voltage $V_D$ is applied.

FIGS. 14A to 14F show the vertical scanning signals $\phi_{G1}$, $\phi_{G2}$, $\phi_{G3}$ and the horizontal scanning signals $\phi_{S1}$, $\phi_{S2}$, $\phi_{S3}$, which are similar to those shown in FIGS. 4A to 4F. Only a difference is that prior to the reset time instant $t_1$ at which the column selection signal $\phi_G$ assumes the high value $V_{\phi R}$, the reset transistors 50-1, 50-2 . . . 50-n having the drains connected to respective column lines 22-1, 22-2 . . . 22-n are made conductive by means of the reset pulse $\phi_R$ to connect the column lines to the ground, and at the reset time instant $t_1$, the sources of all SITs connected to a selected row line are at the earth potential to apply the potential $V_{\phi R}$ to the gates and thus, the forward currents flow into the earth via the column lines and reset transistors to reset the gate potential. FIG. 14A shows a variation of the gate potential in the present embodiment.

In the embodiment illustrated in FIG. 3B, the gate potential is reset by the forward current flowing from the gate to the drain connected to the ground. Contrary to this, in the present embodiment, the gate potential is reset by the forward current flowing from the gate to the source connected to the column line 22 which is connected to the ground via the reset transistor 50. The remaining operations of the present embodiment are entirely same as those of the first embodiment.

It should be noted that in the last embodiment, if a voltage drop across the drain-source of the reset transistor is large, the reset time period might be long and therefore, a forward resistance of the reset transistor has to be small. For this purpose, a ratio of gate width/gate length of the reset transistor is preferably made large.

As explained above in detail according to the invention since there is provided means for biasing reversely the gate region during the readout, it is possible to readout the stored light charge in each pixel in a nondestructive manner and to prolong the storing time period up to substantially the readout period. Further, by providing the means for resetting the gate potential, it is possible to obtain the video signal with the high sensitivity. Moreover, since use is made of the normally-on type SITs, the solid state image setting device according to the invention can be easily manufactured and further can produce the large video signal.

What is claimed is:

1. A solid state image sensing device comprising
a plurality of row lines;
a plurality of column lines;
means for applying row selection signals successively to said row lines;
means for applying column selection signals successively to said column lines;
a plurality of pixels arranged in a matrix form, each comprising a static induction transistor having one main electrode region connected to a column line, the other main electrode region connected commonly, a channel region disposed between said main electrode regions and a gate electrode region, and a capacitance connected between the gate electrode region and a row line; and
means for biasing reversely said gate electrode region at the time of reading out said pixel.

2. A device according to claim 1, wherein said biasing means is so constructed that it produces a row selection signal which has a potential for reading out the pixel while the gate electrode region is biased reversely, and the device further comprises means for resetting a potential of the gate electrode region after the pixel is readout.

3. A device according to claim 2, wherein said resetting means is so constructed that it produces a reset signal for biasing the gate electrode region forwardly, after the row selection signal is produced.

4. A device according to claim 2, wherein said resetting means applies to one of the main electrode regions a potential for forwardly biasing a pn junction between the gate electrode region and said one of the main electrode region.

5. A device according to claim 1, wherein said static induction transistor is formed by a normally-on type static induction transistor.

6. A device according to claim 3, wherein said column selection signal applying means comprises a plurality of column selection transistors, each having a first main electrode connected to respective one of the column lines, a second main electrode connected commonly to a video line and a gate electrode, and a horizontal scanning circuit having outputs each connected to the gate electrode of respective one of the column selection transistors.

7. A device according to claim 6, wherein said video line is connected to one terminal of a voltage supply source whose other terminal is connected to the ground and said other main electrode regions of all the static induction transistors are commonly connected to the ground.

8. A device according to claim 6, wherein said video line is connected to the ground via a load resistor and said other main electrode regions are connected to one terminal of a voltage supply source whose other terminal is connected to the ground.

9. A device according to claim 6, wherein resetting means comprises a plurality of resetting transistors each having a first main electrode connected to respective one of the column lines, a second main electrode connected commonly to a reset bias voltage supply source and a gate connected to an output of the horizontal scanning circuit, which output is also connected to a gate of a column selection transistor connected to a next succeeding column line.

10. A device according to claim 6, wherein said resetting means comprises a resetting circuit whose output is commonly connected to the other main electrode regions of all the static induction transistors.

11. A device according to claim 6, wherein said resetting means comprises a plurality of resetting transistors, each having a first main electrode connected to respective one of the column lines, a second main electrode connected to a reference potential and a gate, and a reset control circuit having an output connected commonly to the gates of said resetting transistors.

* * * * *